United States Patent [19]
King et al.

[11] Patent Number: 5,789,068
[45] Date of Patent: Aug. 4, 1998

[54] PREFORMED SOLDER PARTS COATED WITH PARYLENE IN A THICKNESS EFFECTIVE TO EXHIBIT PREDETERMINED INTERFERENCE COLORS

[75] Inventors: Charles E. King, Westfield; Angelo J. Gulino, Cranbury, both of N.J.

[73] Assignee: Fry's Metals, Inc., Jersey City, N.J.

[21] Appl. No.: 498,247

[22] Filed: Jun. 29, 1995

[51] Int. Cl.⁶ .................................................. B32B 7/02
[52] U.S. Cl. ........................ 428/212; 428/332; 428/407; 428/409; 228/56.3; 228/223; 228/224
[58] Field of Search .................................. 428/403, 407, 428/212, 332, 409; 228/56.3, 223, 224

[56] References Cited

U.S. PATENT DOCUMENTS

| | | | |
|---|---|---|---|
| 3,300,332 | 1/1967 | Gorham et al. | 117/100 |
| 4,225,647 | 9/1980 | Parent | 428/336 |
| 4,298,407 | 11/1981 | Taylor | 148/24 |
| 4,380,518 | 4/1983 | Wydro | 264/13 |
| 4,758,288 | 7/1988 | Versic | 149/6 |
| 4,994,326 | 2/1991 | Shimmura et al. | 428/405 |
| 5,069,972 | 12/1991 | Versic | 428/407 |
| 5,272,007 | 12/1993 | Jenkinson et al. | 428/403 |
| 5,328,522 | 7/1994 | Sowa et al. | 148/23 |

FOREIGN PATENT DOCUMENTS

| | | | |
|---|---|---|---|
| 0 076 681 A1 | 4/1983 | European Pat. Off. | B23K 1/12 |
| 0 448 016 A1 | 9/1991 | European Pat. Off. | B05D 7/24 |
| 0 556 864 A1 | 8/1993 | European Pat. Off. | B23K 35/14 |
| 2 027 617 | 2/1980 | United Kingdom | B32B 15/04 |

*Primary Examiner*—H. Thi Le
*Attorney, Agent, or Firm*—Mintz, Levin, Cohn, Ferris, Glovsky and Popeo, PC

[57] ABSTRACT

The invention provides a solder preform coated with a predetermined thickness of parylene which physically and chemically protects the preform, as well as a provides a unique optical interference coating which reflects at characteristic frequencies. When predetermined thicknesses of parylene are selected, the parylene coating provides an interference coating which causes the solder preforms to appear green, or gold, or blue in color. The parylene coating, which is otherwise colorless and transparent thus enables solder preforms to be visually distinguishable by alloy type (or customer) by the use of colors, or blends of colors. The invention further provides an effective method of visually verifying the reflow status of a solder preform during manufacturing by examining the color of the solder preform after heating. The interference colors provided by the parylene coating do not persist through the reflow process, and thus, the change in color of the solder preform after reflow can be used as an effective visual check to determine if the preform has been heated sufficiently.

40 Claims, 2 Drawing Sheets

PREFORMED SOLDER PARTS COATED WITH PARYLENE IN A THICKNESS EFFECTIVE TO EXHIBIT PREDETERMINED INTERFERENCE COLORS

BACKGROUND AND SUMMARY OF THE INVENTION

The instant invention relates to preformed solder parts, otherwise known as solder preforms, used in the manufacture of electrical and electro-mechanical joints, and more particularly to solder preforms coated with parylene in thicknesses effective to exhibit interference colors.

A wide variety of small solder preforms are used in the manufacture of electrical and electro-mechanical joints. Applications span from solder spheres (50 μm–1 mm diameter) used in the manufacture of Ball Grid Array (BGA) packages, to washers, discs, squares, sleeves, etc. used in the manufacture of connectors, EMI filters, headlamp assemblies, thermal fuses, etc. Typically, preformed solder parts are no bigger than 15 mm in a major axis, and are often sub-millimeter along a minor axis. In this regard, solder preforms are usually too small to be packaged or handled individually, and are therefore handled in multiples which, for smaller parts, can total several million. The small size of solder preforms has lead to several manufacturing and use problems which the present invention intends to address.

It has been found that the small solder preforms often have similar shapes and profiles, and are thus indistinguishable from each other when viewed with the human eye. Furthermore, it is almost impossible to identify, with the unaided eye, solder preforms of the same shape which are made from different alloys. Accordingly, significant care must be exercised to properly label and identify solder preforms as they are made, and subsequently used in manufacturing.

Further, in automated manufacturing systems, solder preforms are typically loaded into vibrating hoppers to properly arrange the preforms with the correct orientation for placement machines. Vibrating the preforms increases the probability of alignment, but also damages soft solder and may lead to darkening of the normally silver lustre, and ultimately to a loss of solderability.

A loss of solderability may also occur if vibrated parts are exposed to humidity and air. Many preforms are coated with a thin layer of flux, either in powdered or liquid form, the latter being dried of any vehicle that may be used to convey the flux active component to the part. The term "flux" is used to describe any material which promotes the soldering process. Frequently fluxes are low melting point and/or water soluble materials which can become sticky when exposed to heat or humidity. Exposure to hot, humid air during manufacturing can thus lead to sticking together of the preforms and increase the difficulty of machine handling and placement.

It is thus a general object of the instant invention to overcome these problems. The instant invention provides a solder preform coated with a predetermined thickness of parylene. It has been found that a layer of parylene applied to the solder preforms in predetermined thicknesses provides both physical and chemical protection to the preforms, as well as a providing a unique optical interference coating which reflects incident light at characteristic frequencies. More specifically, the parylene coating protects the solder preforms from the physical rigors of vibration handling, and further protects the flux coating from atmospheric conditions, such as heat and humidity so that the solder preforms exhibit non-stick characteristics. When predetermined thicknesses of parylene are selected, the parylene coating provides an interference film which causes the solder preforms to appear e.g. green, or blue in color. The interference film coating, which is otherwise colorless and transparent enables solder preforms to be visually distinguishable by alloy type (or customer) by the use of colors, or blends of colors.

The instant invention further provides an effective method of visually verifying the reflow status of a solder preform during manufacturing. In the manufacture of some electro-mechanical assemblies, it is often necessary to study a soldered joint to ascertain whether it has been fully soldered, i.e. heated sufficiently. It has been found that the interference colors provided by the parylene coating do not persist through the reflow process. Accordingly, the change in color of the solder preform after reflow can be used as an effective visual check to determine if the preform has been heated sufficiently.

Accordingly, among the specific objects of the instant invention are: the provision of a solder preform coated with parylene to physically and chemically protect the solder preform; the provision of a solder preform coated with a predetermined thickness of parylene effective to exhibit an interference color; and the provision of a method for visually checking the reflow status of a solder preform during manufacturing.

Other objects, features and advantages of the invention shall become apparent as the description thereof proceeds when considered in connection with the accompanying illustrative drawings.

DESCRIPTION OF THE DRAWINGS

In the drawings which illustrates the best mode presently contemplated for carrying out the present invention.

DESCRIPTION OF THE PREFERRED EMBODIMENT

Figure 1:
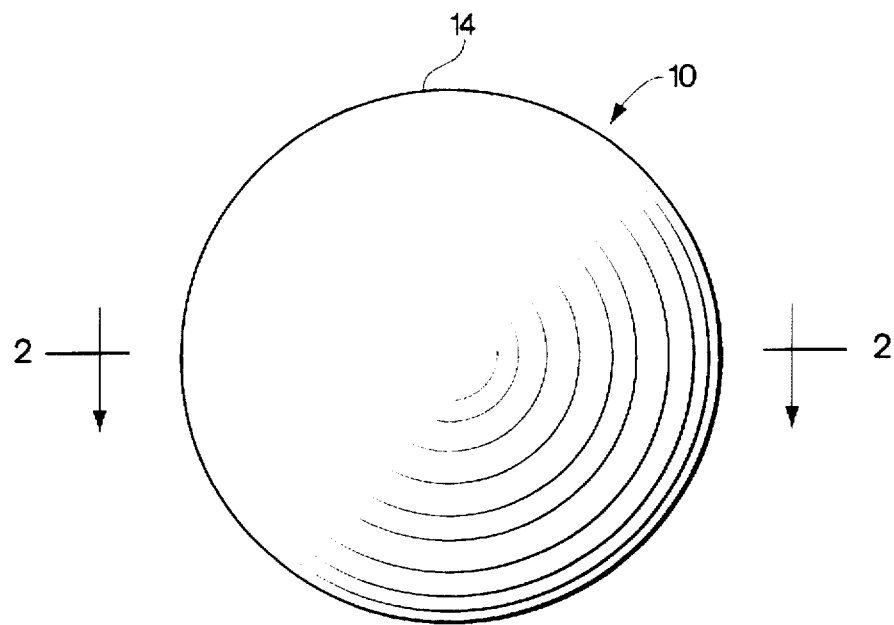
FIG. 1 is a perspective view of a solder sphere coated in accordance with the instant invention.
Figure 2:
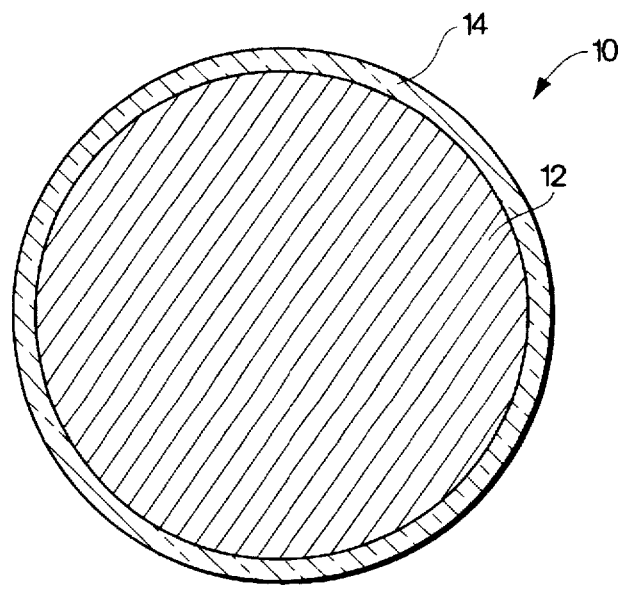
FIG. 2 is a cross-sectional view thereof.

Referring now to the drawings, a coated solder preform in accordance with the instant invention is illustrated and generally indicated at 10 in FIGS. 1–2. As will hereinafter be more fully described, a solder preform 12 is coated with a layer of parylene 14 in a thickness effective to exhibit interference colors.

Parylene is a generic term used to describe a class of poly-p-xylylenes. Various forms of parylene are commercially available for example, from Alpha Metals, Inc. Jersey City, N.J. The following structures represent some commercially available parylene dimers.

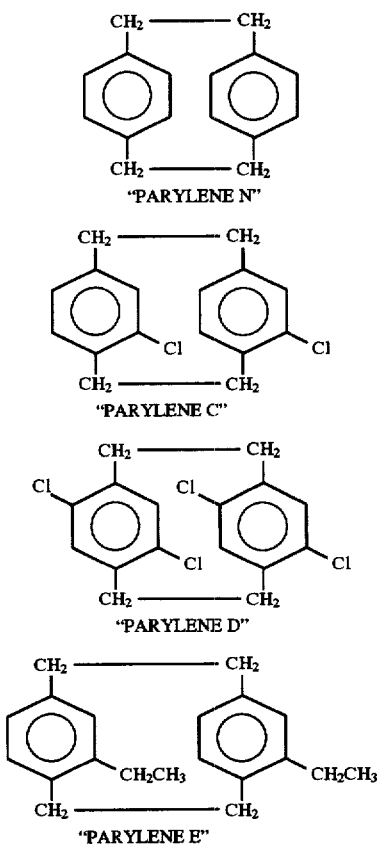

Preferred forms of parylene for the instant invention are those forms of parylene which melt below the melting point of the particular solder alloy used to form the solder preform. For example, common tin-lead solder alloy 63Sn/37Pb has a melting temperature of about 183° C. When 63Sn/37Pb solder is used, Parylene E is a preferred form of parylene because it melts at about 180° C. While Parylene E is specifically described as the preferred embodiment in the instant example, it will be apparent to those skilled in the art that any form of parylene, including those not specifically disclosed herein, as well as combinations thereof, can be appropriately selected to correspond to the specific melting temperature of the particular solder alloy selected for the preform.

In accordance with the invention, parylene is deposited onto the solder preforms by a vapor deposition process which is well known in the art, wherein the parylene monomer is condensed and polymerized onto the surface of the article to be coated. In the vapor deposition process, parylene dimers, as illustrated above, are utilized as a starting material. The parylene dimer is first vaporized at a temperature of about 160° C., and then pyrolytically cleaved at a temperature of about 700° C. to form a reactive monomer vapor. The reactive monomer vapor is then transferred to a deposition chamber where the article to be coated is situated. Within the deposition chamber, the monomer vapor condenses on the article surface to form a parylene polymer or co-polymer film. For coating small articles, such as solder preforms, the articles are usually placed within a rotating tumbler mounted inside the chamber.

The entire parylene deposition process is carried out in a closed system under negative pressure, and usually includes separate chambers for vaporization, pyrolysis, and deposition with such chambers being interconnected by a series of tubular pathways. The more specific details of the parylene process and deposition apparatus are well known to those skilled in the art and will not be described further.

The particular type of solder used in accordance with the instant invention is not particularly critical. Typically, solder preforms are formed from solder alloys of at least two of the following metals: tin, lead, silver, bismuth, indium, antimony and cadmium. Tin lead alloys are typically used in concentration ranges from about 5 to about 70 weight percent tin, and about 5 to about 95 weight percent lead.

Due to the ability of parylene to conform to various shapes, the particular shape of solder preform is not particularly critical. As stated in the background, preformed solder parts are typically no bigger than 15 mm in a major axis, and are often sub-millimeter along a minor axis, and are formed in the shapes of spheres, discs, washers, sleeves, cubes, etc., depending upon the particular manufacturing circumstances. While a solder sphere 12 is specifically disclosed as a representative example in the drawings, it is not intended to limit the scope of the claims set forth below.

Figure 3:
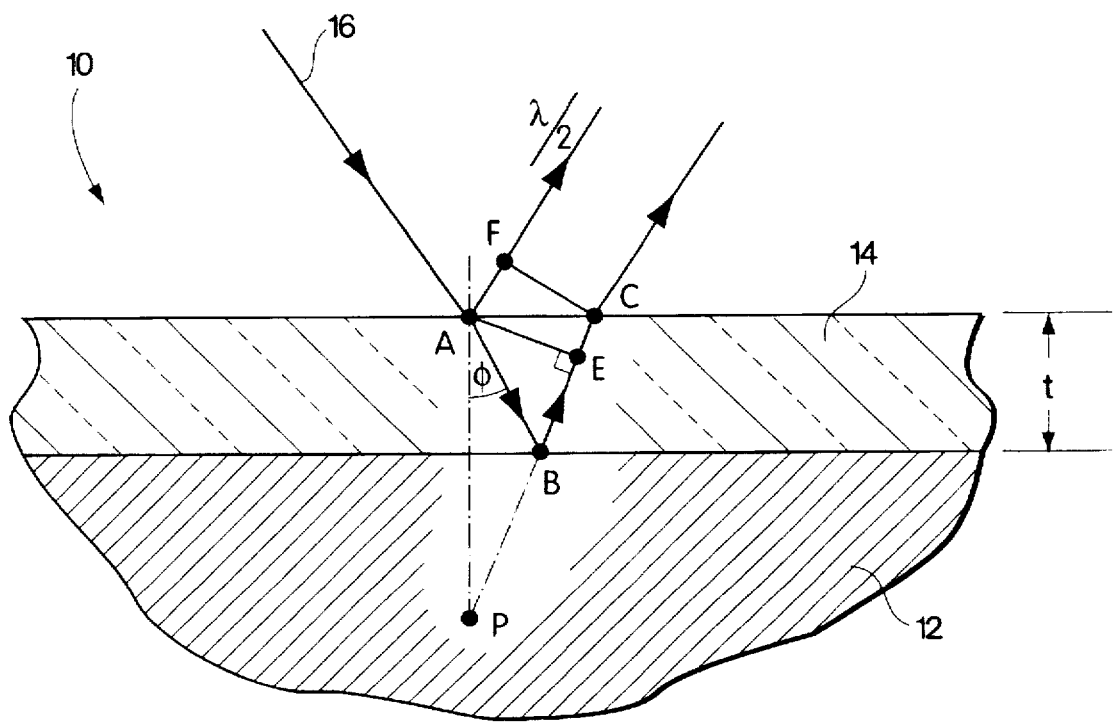
FIG. 3 is a diagrammatical view of the reflection of light through a parylene coating.

In accordance with the instant invention, a layer of parylene 14 is applied to the preformed solder sphere 12 in a thickness effective to exhibit interference colors. Reflective light interference in thin films is a well known physical phenomenon which forms the basis for the instant invention. In this regard, FIG. 3 shows an incident ray of light 16 impinging on a thin transparent film 14 of thickness t, where there is partial reflection and partial transmittance. Light ray 16 can take two routes, AF or ABEC, and the different optical lengths of these paths leads to interference.

The following explanation gives the conditions for constructive and destructive interference, and the generation of color from interference. Light which is reflected will suffer a phase change (or delay) of $\pi$ radians which is equivalent to half of one wavelength, i.e. $\lambda/2$, whenever it is reflected at a rare to dense medium interface, i.e. from air to glass or polymer. No phase change occurs for light travelling from a dense to rare medium. Therefore, at the first reflection, point A in FIG. 3, light is delayed by $\lambda/2$. Light which is transmitted is also delayed relative to the reflected light, as it travels through the denser film medium 14. Light delay in the film 14 is a function of film thickness t, and its refractive index n. Parylene has a refractive index n=1.65. The delay length is given by the expression:

$$2tn \cos \phi$$

where 2tn cos $\phi$=AP=ABEC, n is the refractive index of the film, t is the film thickness, and $\phi$ is the angle PAB. The geometry construct AP in FIG. 3 is merely a convenient way of gaining access to the length ABEC. The distance AP and (EC)n are equivalent for the passage of light.

There may be other $\pi$ radian phase shifts and smaller phase lags due to additional rare to dense medium reflections and transmissions, but eventually some of the light that penetrates the thin film 14 will escape by reflection and rejoin the light reflected at the top surface. As long as the total film thickness t is comparable to the wavelength of incident light, then the various waves will recombine more or less in phase, and constructive or destructive interference will occur. Because there is a phase change equivalent to $\lambda/2$ for reflected rays at point A, the optical path difference between a ray reflected at A and that transmitted and reflected along the path ABEC is equivalent to:

$$2tn \cos \phi + \lambda/2$$

Therefore, constructive interference occurs when:

$$2tn \cos \phi + \lambda/2 = m\lambda$$

where m is an integer 1, 2, 3, 4 etc., i.e. when the waveforms are in phase, and destructive interference occurs when:

$$2tn \cos \phi + \lambda/2 = (m + \frac{1}{2})\lambda$$

$$2tn \cos \phi = m\lambda$$

i.e. when the waveforms are in anti-phase

As a consequence, there is reinforcement for some of the wavelengths that make up incident white light, and for other wavelengths there is loss of intensity, and the resultant reflected light will be of a few dominant wavelengths giving the characteristic strong clear colors seen for thin oil films on water, or in soap bubbles. The dominant wavelength(s) (color) may be changed by changing the thickness of the film (t). However, beyond five to ten phases thick, there is enough randomness of phase introduced to lose a strong color effect.

The situation described above explains the effects seen when a thin film of parylene 14 is coated onto solder spheres 12. Such a film 14 is probably a composite i.e. parylene plus an intrinsic tin oxide layer, but in essence, the same conditions for constructive and destructive interference apply. It is noted that this phenomenon will occur for any thin film polymer layer of suitable thickness and refractive index. In other words, it is contemplated that other transparent thin films may be suitable for the inventive concept. However, only those polymers having particular thermal characteristics (i.e. labile or liquid of low viscosity at 180° C.) will enable a metallurgical bond to form, and are therefore suitable in this application.

It is further noted that the instant phenomenon is equally applicable to solder preforms having either a spherical surface or a flat surface. For a constant, suitable thickness (t) of parylene on a flat substrate, one would expect to see a degree of iridescence, although a predominant color would prevail and iridescent colors would be of colors close to the dominant wavelength, for example dominant blue, with violet and green iridescent colors. At a fixed viewing angle a single color would be seen. However, iridescence occurs when changing the viewing angle, which is virtually unavoidable when viewing a flat substrate with the human eye. For spherical solder balls which are approximately 1 mm in size, the viewing angle is almost always normal to the sphere surface, and therefore a uniform color is seen.

For parylene coatings on solder balls which typically have an underlying coating of intrinsic metal oxide, normally tin IV oxide, the process of interference probably means that destructive interference occurs for the situation wherein:

$$2tn \cos \phi + \lambda/2 = m\lambda$$

The refractive index of tin oxide (1.97–2.093) is higher than that of parylene (1.65). The generation of color is predominantly from destructive rather than constructive interference, i.e. certain wavelengths are lost from incident white light, and a dominant color is seen from the remaining light. It is found that approximately three blue phases can be generated by coating solder spheres with parylene with the last blue phase being substantially less pure/distinctive than the first.

As a dominant blue is the result of loss of yellow, then this for example, could imply a thickness of 440 nm or 0.44 µm which is the destructive thickness for yellow corresponding to the third phase thickness. The table below represents Parylene film thicknesses versus wavelength for destructive interference:

| | | Phase | | | | | |
|---|---|---|---|---|---|---|---|
| | | 1 | 2 | 3 | 4 | 5 | 6 |
| WAVELENGTH | | $\lambda/2$ | $3\lambda/2$ | $5\lambda/2$ | $7\lambda/2$ | $9\lambda/2$ | $11\lambda/2$ |
| $\lambda$violet | 400 nm | 60 | 180 | 300 | 420 | 540 | 660 |
| $\lambda$blue | 440 nm | 66 | 200 | 333 | 467 | 600 | 733 |
| $\lambda$green | 550 nm | 83 | 250 | 416 | 583 | 750 | 916 |
| $\lambda$yellow | 580 nm | 88 | 264 | 440 | 615 | 791 | 967 |
| $\lambda$red | 660 nm | 100 | 300 | 500 | 700 | 900 | 1100 |

(parylene film thickness in (nm) for destructive interference)

In use, to provide a parylene film which removes incident blue/green light rays, resulting in a preform having a red color, the user would select one of the following parylene thicknesses, as taken from the table above: 83 nm, 250 nm, 416 nm, or 583 nm. Each of the above thicknesses would provide a preform having the desired red color. Using this selection technique, it can be appreciated that a variety of different interference colors can be achieved by selecting varying thicknesses of the parylene coating.

Further to the above table, it is estimated that the minimum thickness possible to achieve an interference color is about 50 nm, and that the maximum thickness is about 700 nm. As stated previously, when the parylene thickness is beyond four to five phases thick, there is enough randonmness of phase introduced to lose a strong color effect. Therefore, the maximum thickness of about 700 nm is thought to be a reasonable maximum.

Figure 4:
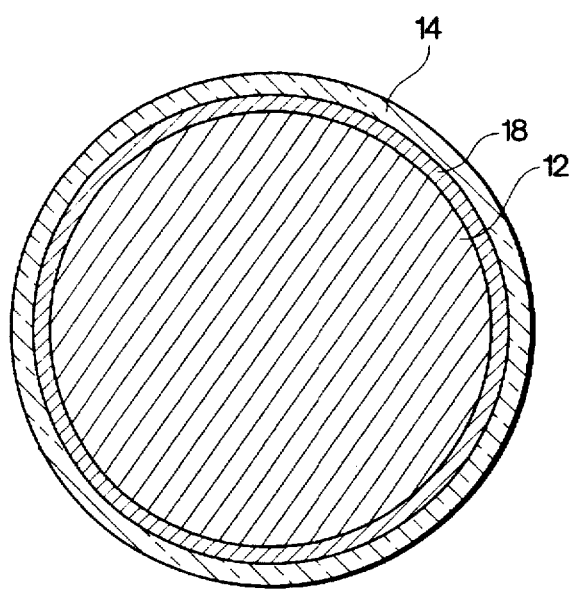
FIG. 4 is a cross-sectional view of a solder sphere coated with a flux material, and further coated with a parylene layer.

Referring now to FIG. 4, a coated solder sphere 10 further includes a coating of flux 18 on the outer surface of the solder sphere 12. The solder sphere coated with the flux material will act in virtually the same manner as the previously described solder preform. The flux coating, with suitable refractive index, i.e. less than outer coating, does not significantly interfere with the appearance of interference colors as provided by the parylene coating, although colors will be more or less iridescent depending on the flux coating thickness.

The instant invention further provides an effective method of visually verifying the reflow status of a solder preform during manufacturing. In the manufacture of some electro-mechanical assemblies, it is often necessary to study a soldered joint to ascertain whether it has been fully soldered, i.e. heated sufficiently. It has been found that the interference colors provided by the parylene coating do not persist through the reflow process. The color does not persist because the parylene coating melts at a temperature of about 180° C. and flows off of the surface of the preform, resulting in an uncoated preform after reflow. Accordingly, the change in color of the solder preform from colored to silver after reflow can be used as an effective visual check to determine if the preform has been heated sufficiently.

The following comparative example is provided for illustrative purpose, and is not intended to limit the scope of the claims which follow.

EXAMPLE

Solder spheres (875±25 µm diameter 10Sn/90Pb alloy) used in the manufacture of Ball Grid Array packages were coated with a layer of Parylene E (4-ethyl-(2,2) paracylophane). The layer thickness was measured mechanically at 2640 Å (corresponding to the second phase destructive thickness for yellow) and the color of the spheres was light blue and easily distinguishable from uncoated counterparts. An aliquot of coated and uncoated spheres were placed in glass containers and shaken for one hour. Uncoated spheres turned from silver to black and the coated (blue) spheres retained their blue color and remained substantially unaffected by the vibration.

Both the coated and uncoated spheres in the as-received and vibrated states, were used in the preparation of a BGA substrate with gold pads. A water soluble RMA flux, eutectic alloy, solder paste was used to solder the alloy spheres to the pads on the substrate. The substrate was reflowed in an ATMOS 2000 belt oven with a peak temperature of 210° C. and time above 183° C. of 46 seconds. A nitrogen atmosphere was used providing 25 ppm of oxygen. All spheres reflowed and made good metallurgical bonds to the substrate. The black, uncoated vibrated spheres retained their black color after reflow. However, the "blue" parylene coated spheres (vibrated and as-received) had returned to a bright gloss silver appearance after reflow.

It can therefore be seen that the instant invention provides an effective coating for physically protecting solder preforms from the rigors of handling and manufacturing, protecting the solder preforms from atmospheric conditions, and for providing a unique optical characteristic to distinguish one type of preforms from another. Furthermore, since the interference colors do not persist through the reflow process, the color coating provide a unique means of verifying the reflow status of the sphere by examining the preform for loss of color after reflow. For these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

We claim:

1. A coated solder preform comprising a solder preform coated with a predetermined thickness of a transparent material effective to exhibit an interference color, said transparent material having a melting point lower than the melting point of said solder preform, wherein said transparent material is a labile material of low viscosity at 180° C. or a liquid of low viscosity at 180° C.

2. The coated solder preform of claim 1, wherein said transparent material comprises a poly-p-xylylene material.

3. The coated solder preform of claim 2, wherein said poly-p-xylylene material has a melting point below 180° C.

4. The coated solder preform of claim 3, wherein said poly-p-xylylene material comprises 4-ethyl-(2,2) paracylophane.

5. The coated solder preform of claim 2 wherein said predetermined thickness is in the range of about 50 nm to about 1000 nm.

6. The coated solder preform of claim 5 wherein said predetermined thickness is in the range of about 60 nm to about 700 nm.

7. A method of determining the reflow status of a solder preform during the manufacture of an electrical or electromechanical joint comprising the steps of:

examining the color of a solder preform coated with a predetermined thickness of a poly-p-xylylene material effective to exhibit an interference color prior to heating the solder preform, wherein said poly-p-xylylene material is a labile material of low viscosity at 180° C. or a liquid of low viscosity at 180° C.; and examining the color of the reflowed solder material after heating whereby the reflow status of the solder preform is determined.

8. The method of claim 7 wherein said examination is a visual examination of the color of the solder preform.

9. A coated solder preform comprising a solder preform having a surface with a coating of flux on said surface and a predetermined thickness of a transparent material effective to exhibit an interference color coated on said coating of flux, said transparent material having a melting point lower than the melting point of said solder preform, wherein said transparent material is a labile material of low viscosity at 180° C. or a liquid of low viscosity at 180° C.

10. The coated solder preform of claim 9 wherein said predetermined thickness of a transparent material comprises a poly-p-xylylene material.

11. A method of distinguishing a first type of solder preform from a second type of solder preform, comprising the steps of:

coating the first type of solder preform with a predetermined thickness of a transparent material effective to exhibit an interference color which produces a first color by destructive interference, said first color distinguishable from the second type of solder preform having a second color, said transparent material having a melting point lower than the melting point of said first type of solder preform, wherein said transparent material is labile or liquid of low viscosity at 180° C.

12. The method of distinguishing types of solder preforms of claim 11, wherein said transparent material comprises a poly-p-xylylene material.

13. The method of distinguishing types of solder preforms of claim 12, wherein said poly-p-xylylene material has a melting point below 180° C.

14. The method of distinguishing types of solder preforms of claim 13, wherein said poly-p-xylylene is 4-ethyl-(2,2) paracylophane.

15. The method of claim 12, wherein said predetermined thickness is in the range of about 50 nm to about 1000 nm.

16. The method of claim 15, wherein said predetermined thickness is in the range of 60 nm to about 700 nm.

17. A method of distinguishing a first type of solder preform from a second type of solder preform, comprising the steps of:

applying a coating of flux on the first type of solder preform, coating onto said coating of flux of said first type of solder preform a predetermined thickness of a transparent material effective to exhibit an interference color which produces a first color by destructive interference, said first color distinguishable from the second type of solder preform having a second color, said transparent material having a melting point lower than the melting point of said first type of solder preform, wherein said transparent material is a labile material of low viscosity at 180° C. or a liquid of low viscosity at 180° C.

18. The method claim 17, wherein said transparent material comprises a poly-p-xylylene.

19. The method of claim 18, wherein said poly-p-xylylene is 4-ethyl-(2,2) paracylophane.

20. A method of coloring a solder preform comprising:

using a refractive index of a transparent material to calculate and thereby select a predetermined thickness of said transparent material effective to exhibit an interference color by destructive interference, wherein said transparent material is a labile material of low viscosity at 180° C. or a liquid of low viscosity at 180° C., coating said solder preform with said predetermined thickness of said transparent material to produce a color coating by destructive interference, said transparent material having a melting point lower than the melting point of said solder preform.

21. The method of claim 20, wherein said transparent material comprises a poly-p-xylylene material.

22. The method of claim 21, wherein said poly-p-xylylene material has a melting point below 180° C.

23. The method of claim 22, wherein said poly-p-xylylene material is 4-ethyl-(2, 2) paracylophane.

24. The method of claim 21, wherein said predetermined thickness is in the range of about 50 nm to about 1000 nm.

25. The method of claim 24, wherein said predetermined thickness is in the range of about 60 nm to about 700 nm.

26. The method of claim 20, wherein said solder preform further includes a coating of flux on said preform, with said predetermined thickness of a transparent material effective to exhibit an interference color coated on said coating of flux.

27. The method of claim 26, wherein said transparent material comprises a poly-p-xylylene.

28. The method of claim 27, wherein said poly-p-xylylene is 4-ethyl-(2.2) paracylophane.

29. A method of distinguishing a first type of solder preform from a second type of solder preform, comprising the steps of:

coating the first type of solder preform with a first predetermined thickness of a first transparent material effective to exhibit an interference color which produces a first color by destructive interference, said first transparent material having a melting point lower than the melting point of said first type of solder preform, wherein said first transparent material is a labile material of low viscosity at 180° C. or a liquid of low viscosity at 180° C.;

coating the second type of solder preform with a second predetermined thickness of a second transparent material effective to exhibit an interference color which produces a second color by destructive interference, said second transparent material having a melting point lower than the melting point of said second type of solder preform, wherein second said transparent material is a labile material of low viscosity at 180° C. or a liquid of low viscosity at 180° C.;

whereby said first and said second types of solder preforms are distinguishable by color.

30. The method of claim 29, wherein said transparent material comprises of poly-p-xylylene.

31. The method of claim 30, wherein said poly-p-xylylene has a melting point below 180° C.

32. The method of claim 31, wherein said poly-p-xylylene is 4-ethyl-(2.2) paracylophane.

33. The method of claim 31, wherein said poly-p-xylylene is 4-ethyl-(2.2) paracylophane.

34. The method of claim 30, wherein said predetermined thickness is in the range of about 50 nm to about 1000 nm.

35. The method of claim 34, wherein said predetermined thickness is in the range of about 60 nm to about 700 nm.

36. The method of claim 34, wherein said predetermined thickness is in the range of about 60 nm to about 700 nm.

37. The method of claim 30, wherein said poly-p-xylylene has a melting point below 180° C.

38. The method of claim 30, wherein said predetermined thickness is in the range of about 50 nm to about 1000 nm.

39. The method of claim 29, wherein said transparent material comprises of poly-p-xylylene.

40. A method of distinguishing a first type of solder preform from an uncoated solder preform, comprising the steps of:

coating the first type of solder preform with a predetermined thickness of a transparent material effective to exhibit an interference color which produces a first color by destructive interference, said first color distinguishable from said uncoated solder preform having a second color, said transparent material having a melting point lower than the melting point of said first type of solder preform, wherein said transparent material is a labile material of low viscosity at 180° C. or a liquid of low viscosity at 180° C.

* * * * *